United States Patent
Yamada (10) Patent No.: US 6,277,530 B1
(45) Date of Patent: Aug. 21, 2001

(54) METHOD FOR MAKING PARTIAL FULL-WAFER PATTERN FOR CHARGED PARTICLE BEAM LITHOGRAPHY

(75) Inventor: Yasuhisa Yamada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/417,099

(22) Filed: Oct. 13, 1999

(30) Foreign Application Priority Data

Oct. 15, 1998 (JP) .................................................. 10-293440

(51) Int. Cl.⁷ ........................................................ G03F 9/00

(52) U.S. Cl. .................................. 430/30; 430/5; 430/296
(58) Field of Search .................................. 430/30, 296, 5

*Primary Examiner*—Christopher G. Young
(74) *Attorney, Agent, or Firm*—Sughrue, Mion, Zinn, Macpeak & Seas, PLLC (57) ABSTRACT

Disclosed is a method for making a partial full-wafer pattern for charged particle beam lithography based on circuit design data. This method has the steps of: conducting the interlayer operation between the circuit design data of a pattern of lithographed layer and the circuit design data of a pattern of base layer underlying the lithographed layer to extract a product-set pattern; and making data of partial full-wafer pattern by setting the product-set pattern to be a target region of partial full-wafer pattern.

7 Claims, 8 Drawing Sheets

METHOD FOR MAKING PARTIAL FULL-WAFER PATTERN FOR CHARGED PARTICLE BEAM LITHOGRAPHY

FIELD OF THE INVENTION

This invention relates to a method for making a partial full-wafer pattern for charged particle beam lithography, and more particularly to, a method for making a partial full-wafer pattern that allows a pattern to be transferred at severer size accuracy.

BACKGROUND OF THE INVENTION

According as the integration density of LSI increases, for the exposure of a fine pattern less than a limitation of optical resolution, instead of photolithography, the lithography using charged particle beam, i.e. electron beam and X-ray, begins to be used.

The charged particle beam lithography using charged particle beam, i.e. electron beam lithography using electron beam, is a technique that a fine pattern less than a limitation of optical resolution is transferred onto a transferred medium using electron beam. Conventionally, such a pattern is written directly onto a substrate by the single-stroked drawing using variable shaping electron beam.

The single-stroked drawing is a method that a pattern of LSI circuit to be written is divided to a size of variable shaping electron beam and part divided is written by using electron beam. It is called variable shaping method. For example, in writing a pattern of LSI circuit a rectangular beam divided into such a shot size that all patterns composing the LSI circuit can be exposed is used in the multiple exposure shots.

However, in the variable shaping method, as the pattern to be written becomes fine, the number of shots increases rapidly. Therefore, the throughput reduces significantly.

Since the throughput of the variable shaping method is thus low, in the field of electron beam lithography, in recent years, used is a so-called partial full-wafer electron beam exposure method that uses a transfer mask for the exposure of electron beam with a desired pattern, like the transfer method by light or X-ray using a mask or a reticle, to enhance the throughput and a repeated pattern is exposed sequentially by electron beam. For example, a pattern requiring 40 to 80 shots in the conventional variable shaping method can be exposed by one shot.

A repeated pattern to be exposed in the partial full-wafer electron beam exposure method is generally called a partial full-wafer pattern. In general, the size of partial full-wafer pattern only has to be smaller than a maximum exposable region that can be exposed by the single partial full-wafer electron exposure. The mask pattern for partial full-wafer pattern is formed, as abored hole with an analogous shape to the repeated pattern, on a transfer mask for partial full-wafer electron exposure.

In making a bored hole on the mask, pattern data for mask pattern to each partial full-wafer pattern is made based on pattern data for partial full-wafer pattern, and then the bored hole is formed on the mask based on that data using an electron beam lithography system.

The mask for partial full-wafer electron beam exposure is generally provided with multiple mask patterns for partial full-wafer pattern and at least one mask pattern for variable shaping.

The partial full-wafer electron beam exposure method is a method that a stencil mask including a mask pattern formed with a bored hole is disposed between the electron gun and the substrate and the mask pattern is transferred onto the substrate by one-time electron beam exposure.

For example, most regions of memory circuit are composed of repeated unit patterns with a certain shape called a cell. A group of unit patterns are formed, as a partial full-wafer pattern, on the mask, and by conducting the electron beam exposure using this mask, a group of cells can be transferred onto the substrate by one shot.

Figure 1:
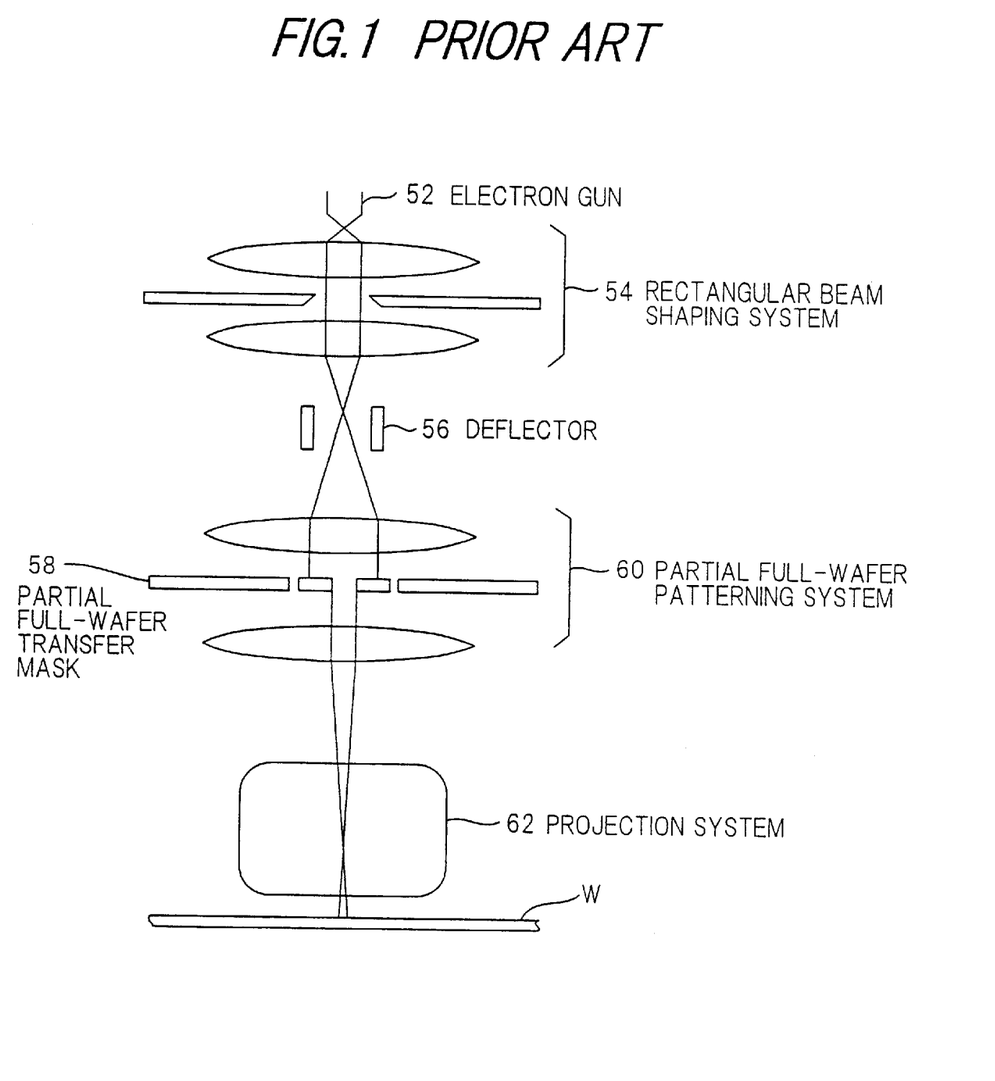
FIG. 1 is an illustration showing the composition of the electron beam lithography system.

Here, referring to FIG. 1, explained briefly is the partial full-wafer electron beam lithography system for conducting the partial full-wafer electron beam exposure.

As shown in FIG. 1, the partial full-wafer electron beam lithography system 50 generally comprises an electron gun 52, a rectangular beam shaping system 54 composed of lenses and an aperture to shape electron beam emitted from the electron gun 52 into rectangular form, a deflector 56 to deflect rectangular electron beam so as to be projected on a desired mask pattern of the partial full-wafer pattern mask below, a partial full-wafer patterning system 60 provided with lenses and a partial full-wafer transfer mask 58 to pattern rectangular electron beam into a partial full-wafer pattern, and a projection system 62 composed of a demagnification projection lens and a deflector to project the partial full-wafer pattern on a wafer W.

Multiple mask patterns for partial full-wafer pattern are formed on one partial full-wafer transfer mask 58, and the higher the selection priority of mask pattern for partial full-wafer pattern is, the closer to the center it is disposed. Also, the partial full-wafer transfer mask 58 is provided with an opening with a large numerical aperture to be used as a mask pattern for variable forming.

To perform the partial full-wafer electron beam exposure, it is necessary to make a partial full-wafer pattern based on the circuit design data. For that purpose, the data processing system is provided as part of the partial full-wafer electron beam exposure system, or as a separate system from the partial full-wafer electron beam exposure system.

Figure 2:
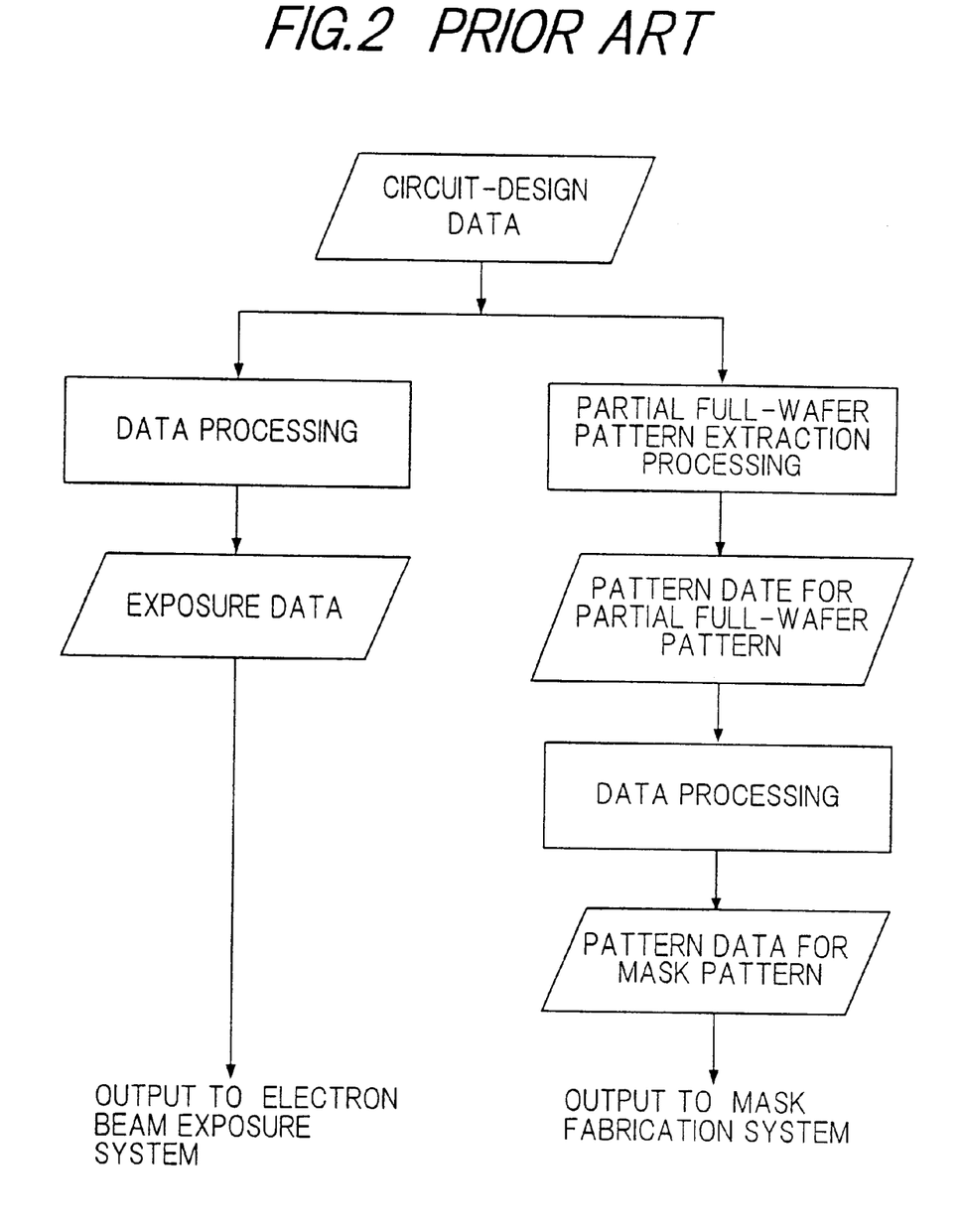
FIG. 2 is a flow chart showing the process to make data for electron beam exposure.

As shown in FIG. 2, the data processing system makes mask data and exposure data from the circuit design data of IC circuit, outputting them. Namely, the data processing system makes the exposure data by the data processing of the circuit design data of IC circuit, outputting it to the electron beam exposure system. Also, it conducts the extraction processing of partial full-wafer pattern from the circuit design data of IC circuit to extract a partial full-wafer pattern, making mask data by the data processing of the partial full-wafer pattern data extracted, outputting it to the mask fabrication system.

The mask data is data for fabricating a mask pattern on the transfer mask based on a partial full-wafer pattern extracted.

The exposure data is data necessary to expose it using the electron beam lithography system, data to indicate the position of pattern in the chip, for example, for a partial full-wafer pattern, data to indicate the position of exposure on the wafer, identification number, which position on the mask the partial full-wafer pattern with that identification number locates at etc. Also, for a variable shaping pattern, it is data to indicate the position of exposure, the size, the code of shape etc.

All of these data are extracted automatically from the circuit design data by the data processing system, then processed.

In conducting the partial full-wafer electron beam exposure, it may be imagined that a repeated pattern (unit pattern) only has to be predetermined as a partial full-wafer pattern. However, in this case, the designer of circuit must be restricted by the shape of unit pattern (repeated pattern) predetermined, therefore the degree of freedom in the designing of circuit must be lost. Therefore, such an optimum circuit designing that allows a desired characteristic to a semiconductor device becomes difficult.

So, in order to obtain the flexibility of circuit designing, it is necessary to extract a partial full-wafer pattern from the circuit design data of a pattern designed freely while taking the repetition into account. Also, in order to conduct the partial full-wafer electron beam exposure effectively, it is necessary to extract the partial full-wafer pattern so that the number of shots is minimized.

This is the extraction processing of partial full-wafer pattern mentioned earlier, and is conducted automatically with the processing to make the exposure data from the circuit design data by the data processing system.

The extraction of partial full-wafer pattern is conducted for circuit data after undergoing the overlap processing or process margin processing.

In the extraction processing of partial full-wafer pattern, at first, repeated patterns are extracted from the circuit data, within a formable region of partial full-wafer pattern. A pattern extracted at this time is called a nominated partial full-wafer pattern. The number of nominated partial full-wafer pattern is not limited. For example, when providing contact holes with a 256 Mbit DRAM, it is more than 300.

In extracting the nominated partial full-wafer pattern, it is calculated how many times each partial full-wafer pattern is used in the chip, and it is calculated how many patterns of rectangle the partial full-wafer pattern is formed with. Then, according to predetermined criteria, the priority of nominated partial full-wafer pattern is determined. Partial full-wafer patterns of a number that can be disposed on the mask actually are selected, as patterns to be subject to the partial full-wafer electron beam exposure, in the order of descending priorities, from the nominated partial full wafer patterns.

The selected partial full-wafer patterns are provided with they are, in the order of identification number, disposed from at the center of deflection area. The deflection-area pattern disposed becomes the mask fabrication data, an d position information thus disposed is given as exposure data. The identification number serves as the recognition number of partial full-wafer pattern.

On the other hand, nominated partial full-wafer patterns that are not selected as the partial full-wafer pattern for exposure due to the low priority are inversely transformed into exposure data of variable rectangle or triangle, written by the variable shaping method Here, a conventional partial full-wafer pattern used in transferring an actual DRAM memory cell circuit is explained in detail.

Figure 5:
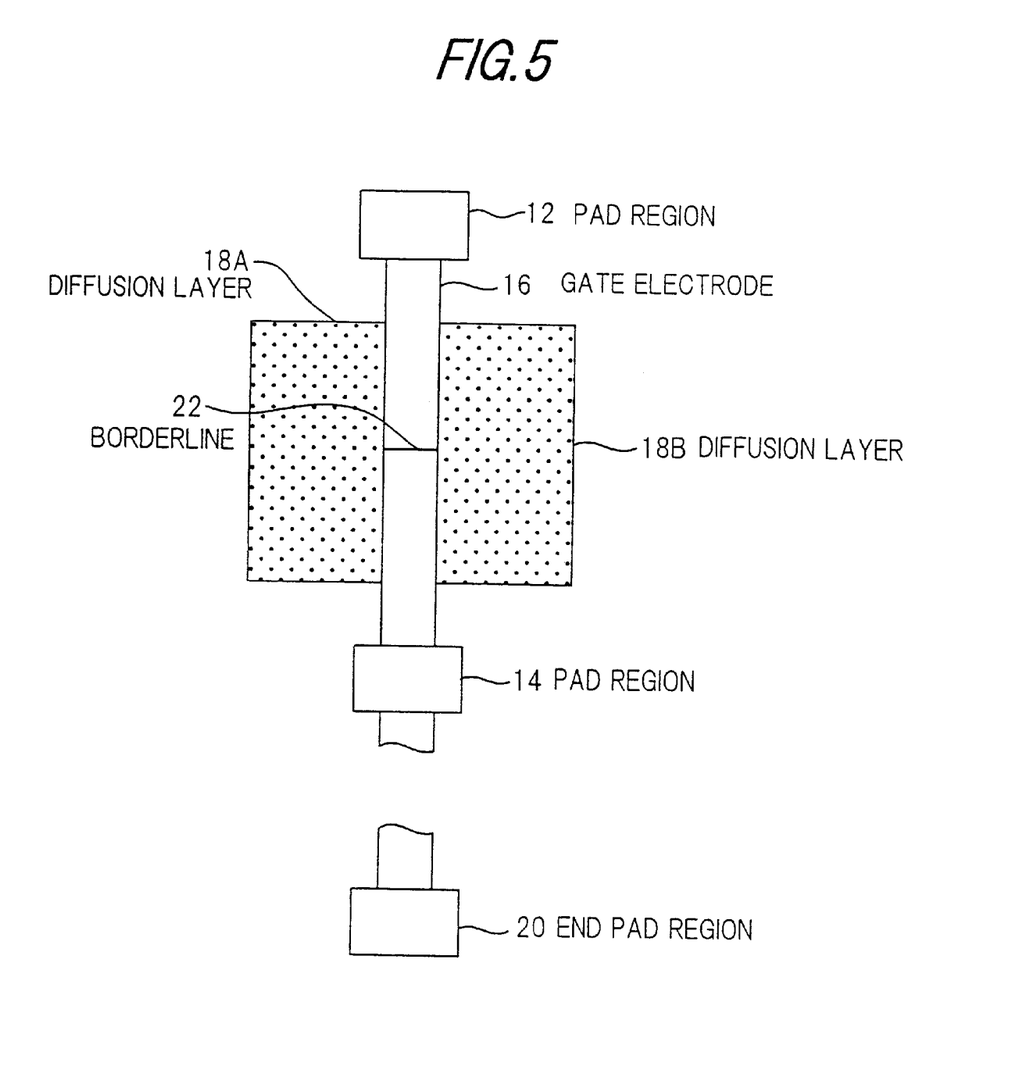
FIG. 5 is an illustration showing the layout pattern of a diffusion layer and a gate electrode.

FIG. 5 shows the layout of a diffusion layer pattern and a gate electrode pattern based on the circuit design data of diffusion layer pattern as a base layer and the circuit design data of gate electrode pattern as a lithographed layer, respectively. This layout includes a gate electrode 16 with pad regions 12, 14 at both ends, diffusion layers 18A, 18B disposed on both sides of the gate electrode 16, part (not shown) which extends below the pad region 14 and where same patterns as the gate electrode 16 and the diffusion layers 18A, 18B are repeated, and an end pad region 20.

At the middle point of the gate electrode 16, there is a borderline 22 of unit patterns that is provided when the circuit designer designs the gate electrode pattern. Namely, the circuit designer divides the gate electrode pattern into an upper block having the pad region 12 and the upper half of the gate electrode 16 extending from the pad region 12 to the borderline 22 and a lower block having the pad region 14 and the lower half of the gate electrode 16 extending from the pad region 14 to the borderline 22.

Figure 3:
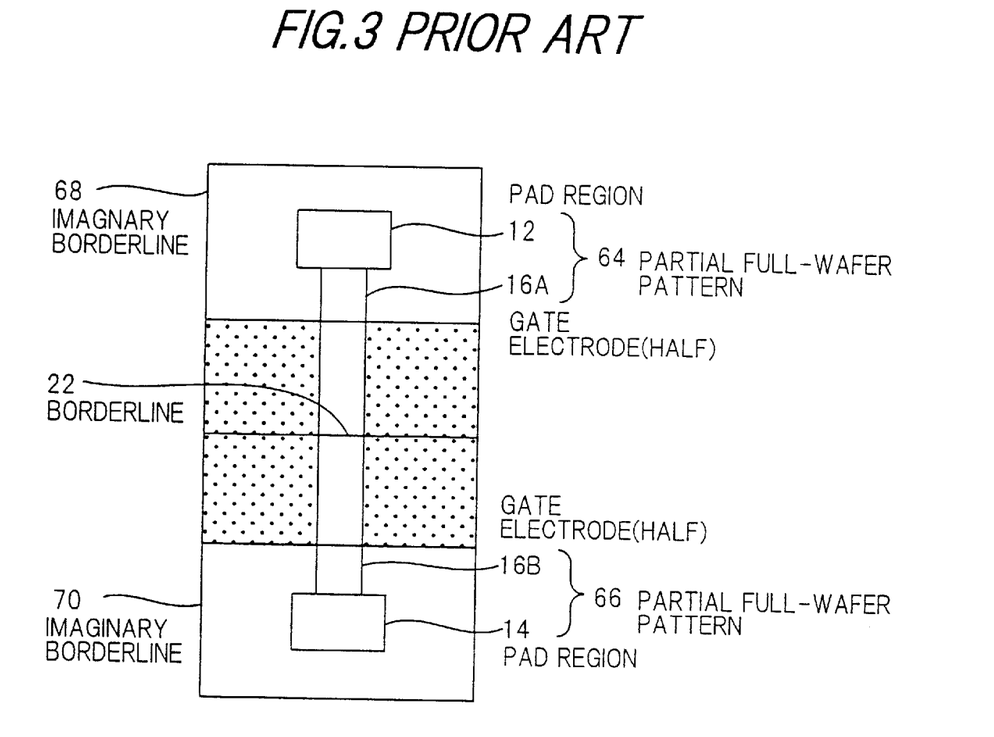
FIG. 3 is an illustration for the explanation of the conventional method for making a partial full-wafer pattern.

In the conventional method for making a partial full-wafer pattern, based on the design data of cell circuit structure, a pattern with a large repetition number, i.e. a large reference number, is searched. For example, as shown in FIG. 3, according to the unit pattern division by the circuit designer, the pattern of the gate electrode 16 is divided into two parts at just the middle point, i.e. the borderline 22, of the gate electrode 16 in the longitudinal direction. Thus, one part is extracted as a partial full-wafer pattern 64 shown in FIG.4A and other part is extracted as a partial full-wafer pattern 66 shown in FIG. 4B.

Figure 4A:
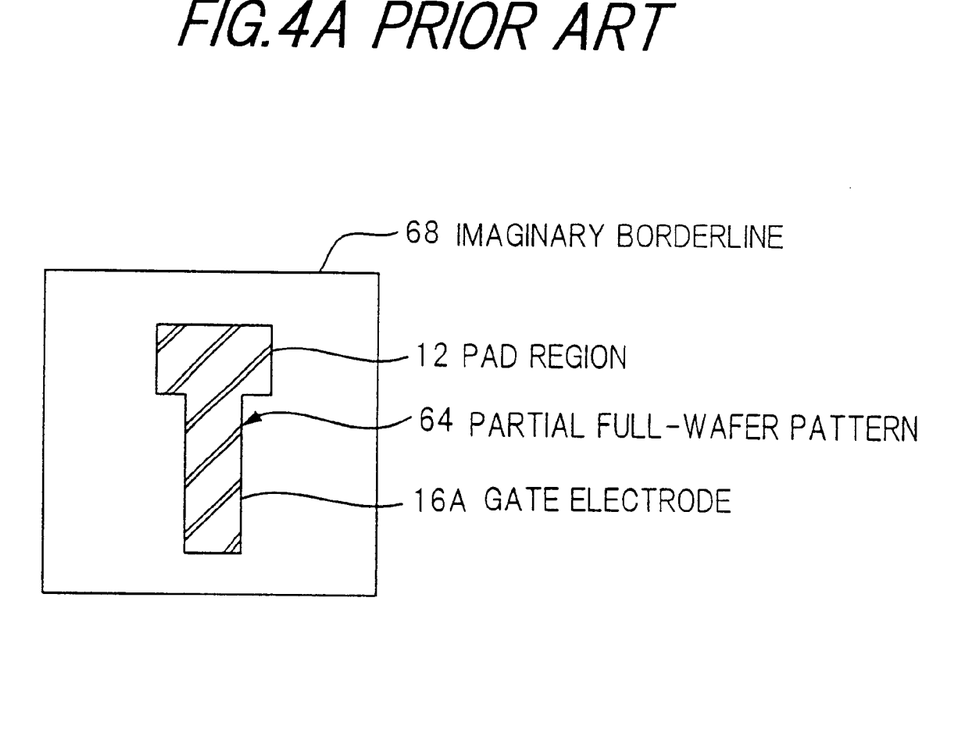
FIGS. 4A and 4b are illustrations showing the partial full-wafer patterns made by the conventional method.
Figure 4B:
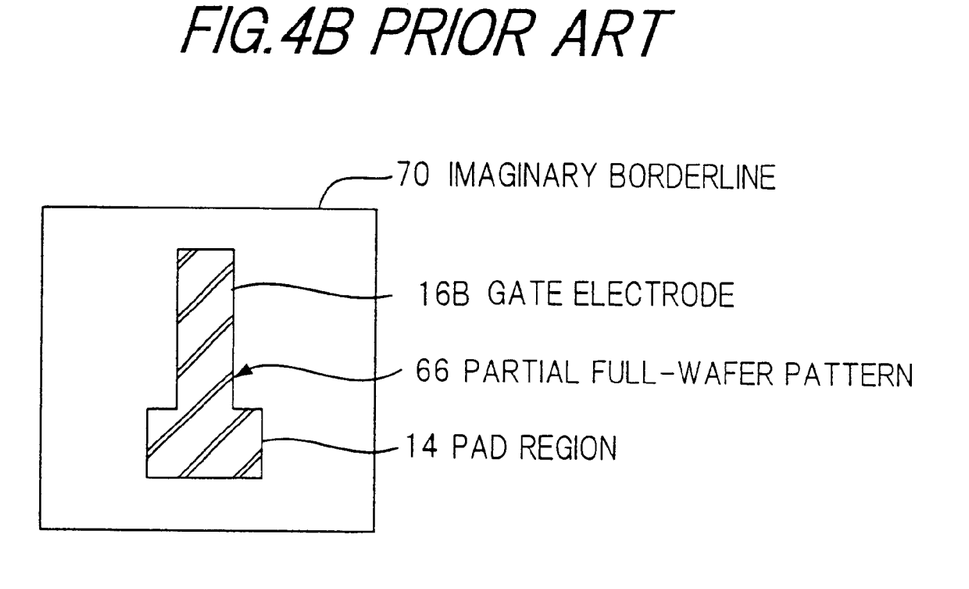

The partial full-wafer pattern 64 has the pad region 12 and half 16A of the gate electrode 16, and the partial full-wafer pattern 66 has the pad region 14 and half 16B of the gate electrode 16. Meanwhile, 68 and 70 are imaginary borderlines to define an imaginary region used in forming the partial full-wafer pattern 64, 66 on the transfer mask (not shown). The pattern data of the partial full-wafer patterns 64, 66 are stored in a storage device (not shown).

Of the layout in FIG. 5, the pattern that could not be extracted as a partial full-wafer pattern is written by the variable shaping method.

However, the conventional extraction method has problems described below.

First, when transferring a pattern onto the wafer using a partial full-wafer pattern extracted according to the conventional extraction method by electron beam exposure, there is a problem that a desired pattern accuracy cannot be obtained at the position where the severe pattern accuracy is required. For example, in the above example, since the gate electrode patterns are jointed on the diffusion layer, the width of gate electrode at the joint position is likely to vary and it is technically difficult to lead the width of the gate electrode on the diffusion layer into a desired pattern accuracy. Therefore, the transistor characteristic of DRAM may disperse.

Second, since the partial full-wafer pattern is determined based on a repetition reference number, the region where severe pattern accuracy is required may not be extracted as a partial full-wafer pattern. Therefore, the region where severe pattern accuracy is required must be written by using the variable shaping method.

SUMMARY OF THE INVENTION

Accordingly, it is an object of the invention to provide a method for making a partial full-wafer pattern for charged particle beam lithography that a pattern to be lithographed can be transferred at severe pattern accuracy.

According to the invention, a method for making a partial full-wafer pattern for charged particle beam lithography based on circuit design data, comprises the steps of:

conducting the interlayer operation between the circuit design data of a pattern of lithographed layer and the circuit design data of a pattern of base layer underlying the lithographed layer to extract a product-set pattern; and making data of partial full-wafer pattern by setting the product-set pattern to be a target region of partial full-wafer pattern.

According to another aspect of the invention, a transfer mask for charged particle beam lithography, comprises:

a partial full-wafer pattern that is made by a method for making a partial full-wafer pattern for charged particle beam lithography based on circuit design data;

wherein the method comprises the steps of:

conducting the interlayer operation between the circuit design data of a pattern of lithographed layer and the circuit design data of a pattern of base layer underlying the lithographed layer to extract a product-set pattern; and making data of partial full-wafer pattern by setting the product-set pattern to be a target region of partial full-wafer pattern.

The inventor of this invention has found that the severe pattern accuracy required to partial full-wafer pattern is actually required as to the positional and dimensional relationships with specific part of the base layer, rather than as to part of lithographed layer itself. For example, for a width of gate electrode, although high pattern accuracy over the entire longitudinal direction is, of course, necessary, severe pattern accuracy especially as to the positional and dimensional relationships with the diffusion layer.

Taking the case of the partial full-wafer pattern described earlier, part requiring severe accuracy as to the relative positional and dimensional relationships is the width of gate electrode in the overlapping region between the gate electrode and the diffusion layer. Thus, it is found that, since the conventional partial full-wafer pattern is divided at the middle (borderline 22) of gate electrode overlying the diffusion layer and in the exposure the divided patterns are jointed together, the pattern accuracy of transferred pattern is reduced due to a deviation of position.

So, the inventor has found that the layout of base layer should be considered when extracting the partial full-wafer pattern of lithographed layer.

Meanwhile, in this invention, the interlayer operation means an operation to calculate the product-set pattern between the circuit design data of a pattern of the lithographed layer and the circuit design data of a pattern of the base layer underlying the lithographed layer. Thus, the product-set pattern described in the method of the invention is a region where a pattern of the lithographed layer and a pattern of the base layer are overlapped each other.

In extracting a partial full-wafer pattern based on circuit design data, prior to making a partial full-wafer pattern in except a target region, the data of partial full-wafer pattern in the target region is made, and a high selection priority in the partial full-wafer electron beam exposure is assigned to the partial full-wafer pattern in the target region.

BRIEF DESCRIPTION OF THE DRAWINGS

The invention will be explained in more detail in conjunction with the appended drawings, wherein.

DESCRIPTION OF THE PREFERRED EMBODIMENTS

The preferred embodiments of this invention will be explained below, referring to the drawings.

Described at first is an example that a method for making a partial full-wafer pattern for charged particle beam lithography according to the invention is applied to a process that a gate electrode pattern is transferred onto a diffusion layer. FIGS. 5 to 9 are provided for the explanation of this example.

In this example, a partial full-wafer pattern for charged particle beam lithography used to transfer the gate electrode pattern is made. A layer including the diffusion layer pattern is a base layer, and a layer including the gate electrode pattern is a lithographed layer.

FIG. 5 shows the layout of the diffusion layer pattern and the gate electrode pattern based on the circuit design data of diffusion layer pattern as the base layer and the circuit design data of gate electrode pattern as the lithographed layer, respectively. This layout includes the gate electrode 16 with the pad regions 12, 14 at both ends, the diffusion layers 18A, 18B disposed on both sides of the gate electrode 16, part (not shown) which extends below the pad region 14 and where same patterns as the gate electrode 16 and the diffusion layers 18A, 18B are repeated, and the end pad region 20.

At the middle point of the gate electrode 16, there is the borderline 22 of unit patterns that is provided when the circuit designer designs the gate electrode pattern. Namely, the circuit designer divides the gate electrode pattern into the upper block having the pad region 12 and the upper half of the gate electrode 16 extending from the pad region 12 to the borderline 22 and the lower block having the pad region 14 and the lower half of the gate electrode 16 extending from the pad region 14 to the borderline 22.

Figure 6:
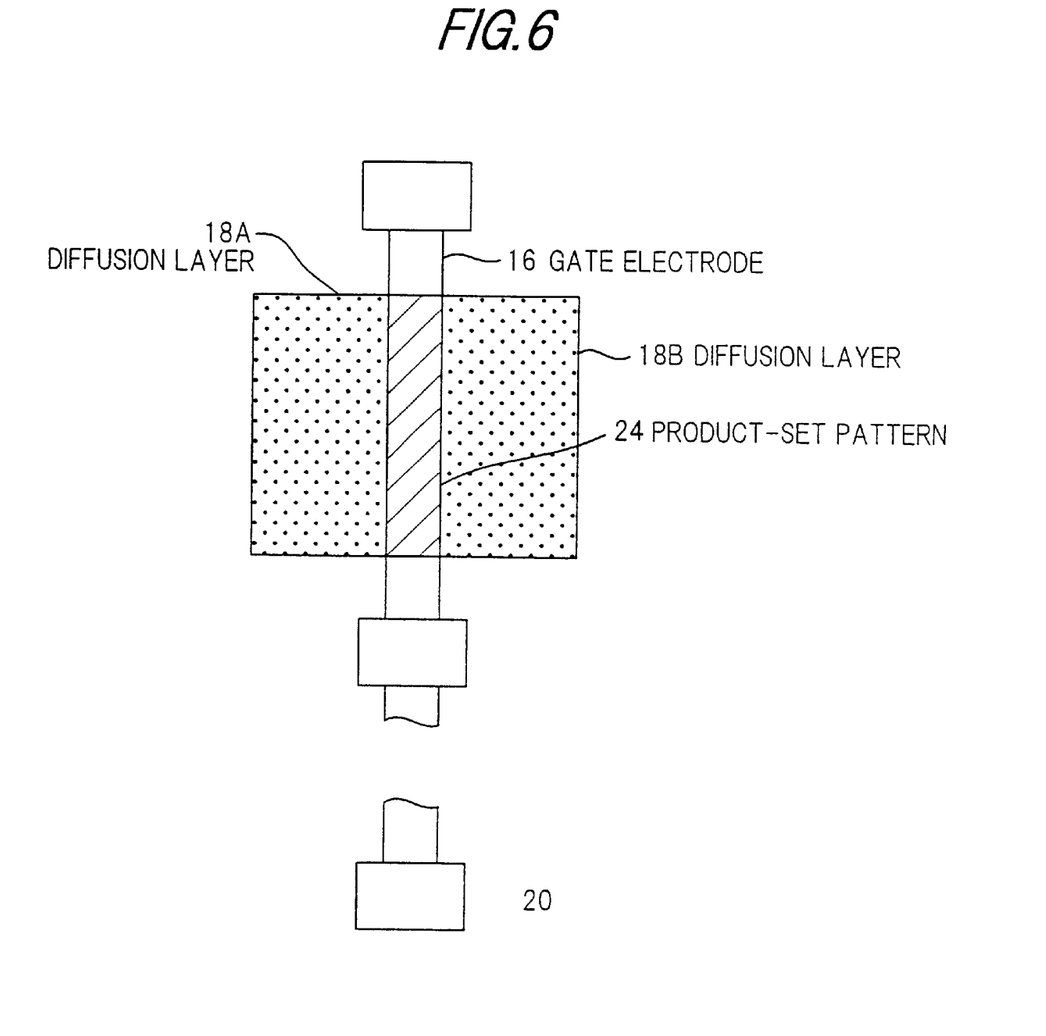
FIG. 6 is an illustration showing a product-set pattern.

In making a partial full-wafer pattern, at first, the interlayer operation between the circuit design data of gate electrode pattern in the gate electrode layer as the lithographed layer and the circuit design data of diffusion layer pattern in the diffusion layer as the base layer is conducted, thereby extracting a product-set pattern 24 shown in FIG. 6.

Here, the product-set pattern 24 corresponds to crossover part of the gate electrode 16 to cross the diffusion layers 18A, 18B.

Then, the data of partial full-wafer pattern is made setting the product-set pattern 24 to be a target region.

Figure 7:
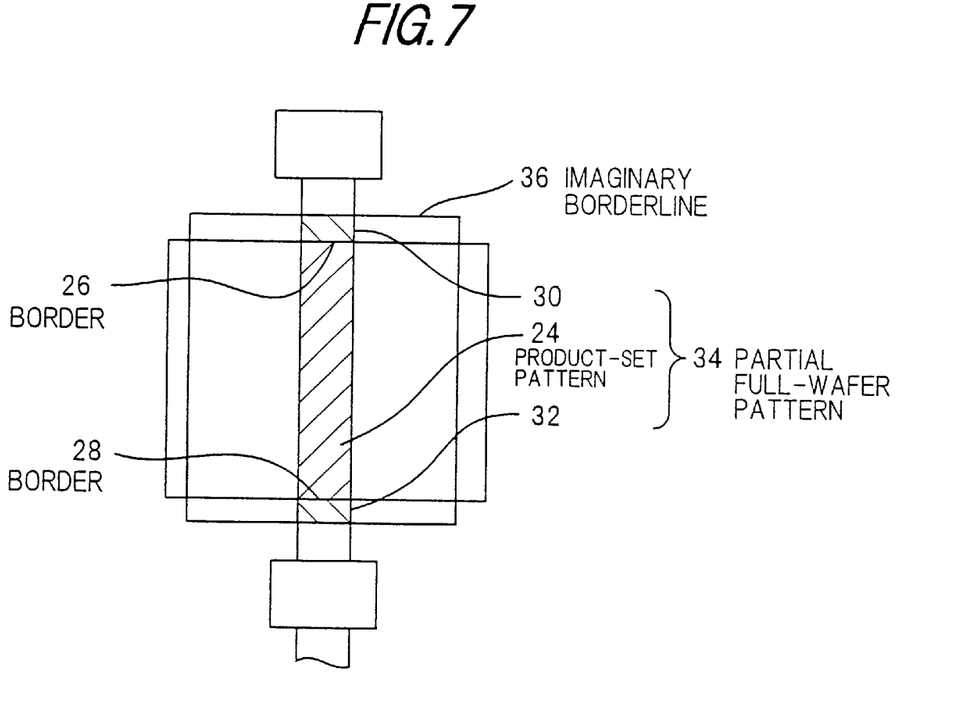
FIG. 7 is an illustration showing a partial full-wafer pattern that the product-set pattern is provided with margins.

In making the data of partial full-wafer pattern, as shown in FIG. 7, after the step of extracting the product-set pattern 24, an expanded pattern that, in addition to the product-set pattern 24, parts 30, 32 of the gate electrode pattern 16 continuing from the borderlines 26, 28 of the product-set pattern 24 are included as margins is set to be a target region. The data of a partial full-wafer pattern 34 of that target region is made. Here, 36 is an imaginary borderline that defines an imaginary region used in transforming the partial full-wafer pattern 34 onto a transfer mask (not shown).

Figure 8:
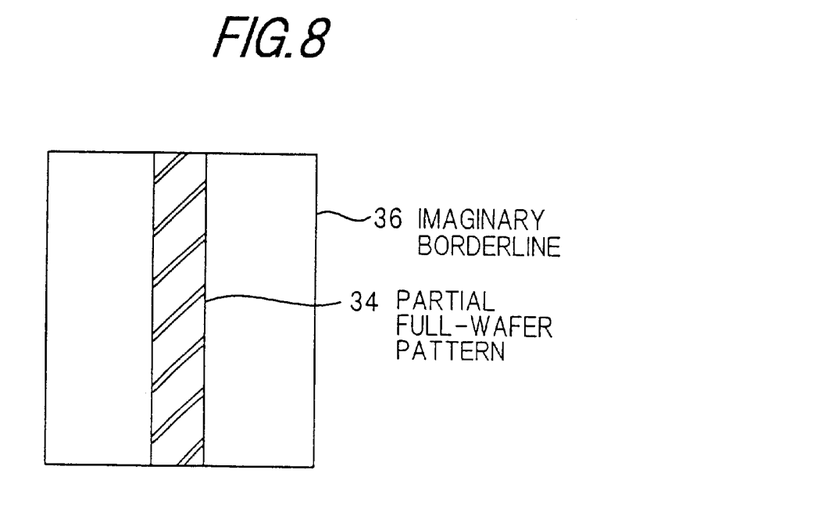
FIG. 8 is an illustration showing the partial full-wafer pattern in FIG. 7.

The partial full-wafer pattern 34 obtained through the above steps is, as shown in FIG. 8, disposed within the imaginary borderline 36. The data of the partial full-wafer pattern 34 is stored in a storage device (not shown).

In making the mask of the partial full-wafer pattern 34, the data of the partial full-wafer pattern 34 is read out from the storage device, and then the bored hole of the partial full-wafer pattern 34 is formed on the mask substrate based on that pattern data using a known electron beam lithography system, thereby the transfer mask is formed.

Meanwhile, the imaginary borderline 36 is used to define the boundaries bordering the other partial full-wafer pattern on the transfer mask.

For part in FIG. 5 to which the partial full-wafer pattern 34 cannot be applied, for example, for the upper part of the gate electrode 16 including the pad region 12 and the lower part of the gate electrode 16 including the pad region 14, another partial full-wafer pattern (not shown) is made.

Also, for part to which the partial full-wafer pattern 34 can be applied, the partial full-wafer pattern 34 is applied. When there is a repeated pattern in another part except the part to which partial full-wafer pattern 34 can be applied, a partial full-wafer pattern with another form (not shown) is made like the above method.

Also, for part to which the partial full-wafer pattern 34 and the other partial full-wafer pattern cannot be applied, for example, for the pad region 20 at lower end, its pattern is transferred using the variable shaping method as before.

Figure 9:
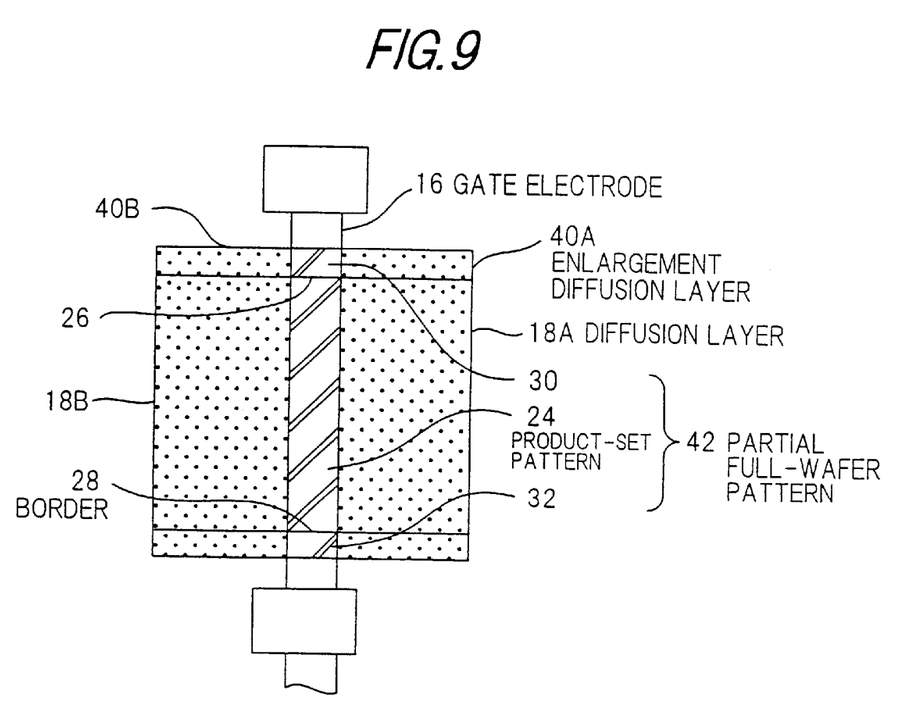
FIG. 9 is an illustration showing another method to provide the partial full-wafer pattern with margins.

Another method to provide the product-set pattern 24 with the margin regions 30, 32 is to expand, in advance, the pattern of the diffusion layers 18A, 18B to provide the pattern of expanded diffusion layers 40A, 40B on the base layer, as shown in FIG. 9.

In this method, when making the data of partial full-wafer pattern, after the step of extracting the product-set pattern 24, the pattern of the diffusion layers 18A, 18B is expanded so that it includes the parts 30 and 32 of the pattern of the gate electrode 16, thereby providing the pattern of the expanded diffusion layers 40A, 40B. Then, a product-set pattern 42 is extracted, and the extracted product-set pattern 42 is unalteredly used as a partial full-wafer pattern 42.

In the conventional method, as described earlier, the partial full-wafer pattern is made by jointing the exposure shots at the gate electrode on the diffusion layer where severe pattern accuracy is required.

In this embodiment, the partial full-wafer pattern is made handling essentially important part, i.e. the gate electrode regions to cross the diffusion layers 18A, 18B in a lump. Therefore, when conducting the partial full-wafer charged particle beam exposure using the transfer mask made in this embodiment to transfer the gate electrode pattern onto the diffusion layer, it is not necessary to joint the exposure shots at the gate electrode region on the diffusion layer. Accordingly, the gate electrode pattern can be precisely transferred onto the diffusion layer within severe allowable pattern accuracy.

Also, in this embodiment, since the partial full-wafer pattern 34 includes the margins, the deviation of position, which is likely to occur when positioning the partial full-wafer pattern, can be compensated.

Therefore, MOSFET that the gate electrode pattern is transferred using the partial full-wafer transfer mask made by the method in the embodiment has a high pattern accuracy as to gate electrode. So, comparing with MOSFET made using the partial full-wafer transfer mask including a partial full-wafer pattern made by the conventional method, the dispersion of characteristic can be reduced and a good transistor characteristic can be obtained.

Advantages of the Invention:

In the invention, the interlayer operation between the circuit design data of the lithographed layer and the circuit design data of the base layer underlying the lithographed layer is conducted, thereby the product-set pattern is extracted. Then, the data of partial full-wafer pattern is made setting the product-set pattern to be a target region. Thus, the partial full-wafer pattern is made handling essentially important part, i.e. part to overlap with the pattern of base layer, of a lithographed pattern in a lump.

Therefore, by conducting the partial full-wafer charged particle beam exposure using the transfer mask made according to this invention, the pattern of lithographed layer can be precisely transferred onto the base layer at severe pattern accuracy.

So, comparing with semiconductor device made by using the partial full-wafer transfer mask made by the conventional method, the semiconductor device made by using the transfer mask made according to the method of this invention has a reduced dispersion of characteristic and a good transistor characteristic.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for making a partial full-wafer pattern for charged particle beam lithography based on circuit design data, comprising the steps of:

conducting the interlayer operation between the circuit design data of a pattern of lithographed layer and the circuit design data of a pattern of base layer underlying said lithographed layer to extract a product-set pattern; and making data of partial full-wafer pattern by setting said product-set pattern to be a target region of partial full-wafer pattern.

2. A method for making a partial full-wafer pattern for charged particle beam lithography, according to claim 1, further comprising the step of:

after extracting said product-set pattern, setting an expanded pattern that includes part of said pattern of lithographed layer to continue from said product-set pattern as a margin region to be said target region of partial full-wafer pattern, in addition to said product-set pattern.

3. A method for making a partial full-wafer pattern for charged particle beam lithography, according to claim 1, further comprising the steps of:

after extracting said product-set pattern, expanding said pattern of base layer so as to include part of said pattern of lithographed layer to continue from said product-set pattern;

conducting the interlayer operation between the circuit design data of said pattern of lithographed layer and the circuit design data of said expanded pattern of base layer underlying said lithographed layer to extract a second product-set pattern; and making data of partial full-wafer pattern by setting said second product-set pattern to be a target region of partial full-wafer pattern.

4. A method for making a partial full-wafer pattern for charged particle beam lithography, according to claim 1, wherein:

data of partial full-wafer pattern for a priority target region is made by priority, and then data of partial full-wafer pattern is made for a pattern except a pattern included in said priority target region of lithographed layer.

5. A method for making a partial full-wafer pattern for charged particle beam lithography, according to claim 1, wherein:

a pattern of lithographed layer that is the rest of the pattern extracted as said partial full-wafer pattern is lithographed by the variable shaping method.

6. A method for making a partial full-wafer pattern for charged particle beam lithography, according to claim 5, wherein:

said partial full-wafer pattern made is stored with an identification number, and the original identification number of the pattern of lithographed layer and the original identification number of the pattern of base layer are stored.

7. A method for making a partial full-wafer pattern for charged particle beam lithography, according to claim 1, wherein:

said partial full-wafer pattern is a partial full-wafer pattern for charged particle beam lithography used in making a MOSFET, said lithographed layer is a layer for gate electrode, and said base layer is a diffusion layer.

* * * * *